(12) United States Patent
Ikeda et al.

(10) Patent No.: US 8,237,170 B2
(45) Date of Patent: Aug. 7, 2012

(54) SCHOTTKY DIAMOND SEMICONDUCTOR DEVICE AND MANUFACTURING METHOD FOR A SCHOTTKY ELECTRODE FOR DIAMOND SEMICONDUCTOR DEVICE

(75) Inventors: Kazuhiro Ikeda, Itami (JP); Hitoshi Umezawa, Tsukuba (JP); Shinichi Shikata, Tsukuba (JP)

(73) Assignee: National Institute of Advanced Industrial Science and Technology (JP)

( * ) Notice: Subject to any disclaimer, the term of this patent is extended or adjusted under 35 U.S.C. 154(b) by 118 days.

(21) Appl. No.: 12/597,578

(22) PCT Filed: Apr. 14, 2008

(86) PCT No.: PCT/JP2008/057283
§ 371 (c)(1),
(2), (4) Date: Jan. 4, 2010

(87) PCT Pub. No.: WO2008/136259
PCT Pub. Date: Nov. 13, 2008

(65) Prior Publication Data
US 2010/0117098 A1    May 13, 2010

(30) Foreign Application Priority Data

Apr. 27, 2007  (JP) .................................. 2007-117815
Apr. 27, 2007  (JP) .................................. 2007-117823

(51) Int. Cl.
*H01L 29/15* (2006.01)
(52) U.S. Cl. .......... 257/77; 257/455; 257/476; 257/486; 257/E29.004; 438/105; 438/570
(58) Field of Classification Search .................... None
See application file for complete search history.

(56) References Cited

U.S. PATENT DOCUMENTS

| 4,982,243 A | 1/1991 | Nakahata et al. |
| 5,202,571 A * | 4/1993 | Hirabayashi et al. ........... 257/10 |
| 2002/0080637 A1 * | 6/2002 | Yi et al. ........................ 363/147 |

FOREIGN PATENT DOCUMENTS

JP    1-161759 A    6/1989
(Continued)

OTHER PUBLICATIONS

International Search Report dated Jun. 17, 2008, issued in corresponding international application No. PCT/JP2008/057283.

*Primary Examiner* — Benjamin Sandvik
*Assistant Examiner* — Scott R Wilson
(74) *Attorney, Agent, or Firm* — Ostrolenk Faber LLP

(57) ABSTRACT

To provide a Schottky electrode in a diamond semiconductor, which has a good adhesion properties to diamonds, has a contacting surface which does not become peeled due to an irregularity in an external mechanical pressure, does not cause a reduction in yield in a diode forming process and does not cause deterioration in current-voltage characteristics, and a method of manufacturing the Schottky electrode.

A Schottky electrode which includes: scattered island-form pattern Pt-group alloy thin films which are formed on a diamond surface formed on a substrate, in which the Pt-group alloy includes 50 to 99.9 mass % of Pt and 0.1 to 50 mass % of Ru and/or Ir, or which includes electrodes in a scattered island pattern, including: scattered island-form pattern metal thin films which are formed on a diamond surface formed on a substrate and include one selected from Pt and Pd; and metal thin films which include one selected from Ru, Ir and Rh and are provided on all of the metal thin films which include one selected from Pt and Pd, and a method of manufacturing the Schottky electrode.

14 Claims, 2 Drawing Sheets

FOREIGN PATENT DOCUMENTS

| | | |
|---|---|---|
| JP | 1-246867 A | 10/1989 |
| JP | 3-110824 A | 5/1991 |
| JP | 7-130981 A | 5/1995 |

* cited by examiner (1) NUMBER OF REMAINING DEVICES AFTER ONE-HOUR ULTRASONIC CLEANING
(ORIGINAL TOTAL NUMBER IS 800)

(2) FURTHER PEELING USING SELLOTAPE

US 8,237,170 B2

SCHOTTKY DIAMOND SEMICONDUCTOR DEVICE AND MANUFACTURING METHOD FOR A SCHOTTKY ELECTRODE FOR DIAMOND SEMICONDUCTOR DEVICE

CROSS REFERENCE TO RELATED APPLICATIONS

The present application is a 35 U.S.C. §371 National Phase conversion of PCT/JP2008/057283, filed Apr. 14, 2008, which claims benefit of Japanese Application Nos. 2007-117815, filed Apr. 27, 2007 and 2007-117823, filed Apr. 27, 2007, the disclosures of which are incorporated herein by reference. The PCT International Application was published in the Japanese language.

TECHNICAL FIELD

The present invention relates to a Schottky electrode for use in power electronics and various other diamond devices and sensors, and more particularly, to a Schottky electrode for a diamond semiconductor device and a method of manufacturing the Schottky electrode.

BACKGROUND ART

In conventional techniques, gold, platinum, palladium, molybdenum and the like are used as Schottky electrodes (see Japanese Unexamined Patent Application, First Publication No. H01-161759). In addition, gold, tungsten, molybdenum, niobium, tantalum, polysilicon, nickel, platinum, tungsten carbide, molybdenum carbide, tantalum carbide, niobium carbide, tungsten silicide, molybdenum silicide and the like are used as Schottky electrodes for p-type semiconductor diamonds (see Japanese Unexamined Patent Application, First Publication No. H01-246867). Moreover, metals having a melting point of 400 to 700° C., such as aluminum, antimony, tellurium and zinc are used as Schottky electrodes (Japanese Unexamined Patent Application, First Publication No. H03-110824).

It is known that platinum can be used as Schottky electrodes provided for diamond Schottky diodes. However, it cannot be said that platinum has good adhesion properties with respect to diamonds and there is a problem in that a contact surface becomes peeled due to an irregularity in an external mechanical pressure. Particularly, in diamond semiconductors, yield is reduced when a diode forming process is performed.

Moreover, it is thought that an irregularity in adhesion properties of electrodes relate to an irregularity in a Schottky barrier height in the electrodes and that this is the reason deterioration occurs in current-voltage characteristics.

DISCLOSURE OF INVENTION

Problems to be Solved by the Invention

The present invention provides a Schottky electrode which is provided for a diamond Schottky diode. The Schottky electrode has good adhesion properties with respect to diamonds and has a contact surface which does not become peeled due to an irregularity in external mechanical pressure. In addition, since the Schottky electrode has good adhesion properties with respect to oxides, the fixing of a Pt electrode to a structure using an insulating film is easily performed by Ru. Accordingly, there is provided a Schottky electrode for a diamond semiconductor, which does not cause a reduction in yield in a diode forming process and does not cause deterioration in current-voltage characteristics, and a method of manufacturing the Schottky electrode.

Means for Solving the Problem

In order to achieve the object, characteristics of various alloys were tested in the present invention, and as a result, it was found that a type of Pt-group alloy has excellent characteristics with respect to diamond semiconductors. In this manner, the present invention was completed.

That is, the present invention provides a Schottky diode which comprises, a diamond substrate; and Pt-group alloy thin films formed by a Pt-group alloy on a surface of the diamond substrate in a scattered islands pattern. Furthermore, in the present invention, the Pt-group alloy includes 50 to 99.9 mass % of Pt, and 0.1 to 50 mass % of Ru and/or Ir.

In the present invention, the Pt-group alloy may include Pt and Ru.

In the present invention, the Pt-group alloy may include Pt and Ir.

In the present invention, the Pt-group alloy may include Pt and Rh.

In the present invention, it is desired that the diamond surface is made of an oxygen-terminated diamond.

Further, in the present invention, adhesion properties and mechanical strength resistance were successfully improved by forming different metal electrodes on metal Schottky electrodes, which included at least one selected from the group consisting of Pt and Pd and were provided on a surface of the diamond substrate. That is, the present invention provides a Schottky diode including electrodes in a scattered islands pattern which comprises, a diamond substrate, metal thin films which include at least one selected from the group consisting of Pt and Pd and are formed on a surface of the diamond substrate in a scattered islands pattern, and metal thin films which include at least one selected from the group consisting of Ru, Ir and Rh and are provided on all of the metal thin films including at least one selected from the group consisting of Pt and Pd.

In the present invention, a pattern of the metal thin films which include at least one selected from the group consisting of Ru, Ir and Rh may be similar to a pattern of the lower metal thin films which include at least one selected from the group consisting of Pt and Pd, and the metal thin films which include at least one selected from the group consisting of Ru, Ir and Rh may be larger than the metal thin films which include at least one selected from the group consisting of Pt and Pd.

In the present invention, insulating films of $SiO_2$ or $Al_2O_3$ may be formed between the electrodes in a scattered islands pattern.

In the present invention, the surface of the diamond substrate may be made of an oxygen-terminated diamond.

In addition, the present invention provides a method of manufacturing a Schottky electrode which comprises, a first step of preparing a resist or a metal mask on a surface of a diamond film formed on a substrate in pattern (1) of the Schottky electrode, and forming metal thin films including at least one selected from the group consisting of Pt and Pd by an electron-beam evaporation method or a sputtering method thereon, and a second step of preparing a resist or a metal mask in pattern (2) of the Schottky electrode, and forming metal thin films including at least one selected from the group consisting of Ru, Ir and Rh by the electron-beam evaporation method or the sputtering method thereon.

In the manufacturing method of the present invention, the patterns (1) and (2) may be similar to each other, and an area of the pattern (2), in which the metal thin films including at least one selected from the group consisting of Ru, Ir and Rh which are formed on the metal thin films including at least one selected from the group consisting of Pt and Pd are provided, may have the same size as or may be larger than an area of the pattern (1) in which the metal thin films including at least one selected from the group consisting of Pt and Pd are provided.

The manufacturing method of the present invention, further comprises, forming insulating films of $SiO_2$ or $Al_2O_3$, after the first step, and etching the insulating films of $SiO_2$ or $Al_2O_3$ in regions corresponding to the metal thin films including at least one selected from the group consisting of Pt and Pd or regions covering the metal thin films including at least one selected from the group consisting of Pt and Pd, before the second step.

EFFECTS OF THE INVENTION

Regarding the Schottky electrode of the present invention in a diamond semiconductor device, the Schottky electrode height could be controlled in accordance with the ratio of various metals in an alloy. That is, in the case of included Pt and Ru and/or Ir in the alloy, the Schottky electrode height can be controlled in the range of 1.6 to 2.5 eV in accordance with a mixing ratio. The Schottky electrode of the present invention is very hard and has excellent adhesion properties and heat resistance. In addition, the Schottky electrode exhibits excellent characteristics so that adhesion properties with respect to diamonds is good, a contacting surface does not become peeled due to an irregularity in an external mechanical pressure, yield is not reduced in a diode forming process and current-voltage characteristics do not deteriorate, and a use ratio of Pt can be reduced. Accordingly, there is an advantage in that cost is reduced. Moreover, since the method of manufacturing the Schottky electrode of the present invention in a diamond semiconductor device is a simple process, the Schottky electrode has an extremely high potential use value.

BEST MODE FOR CARRYING OUT THE INVENTION

Figure 1:
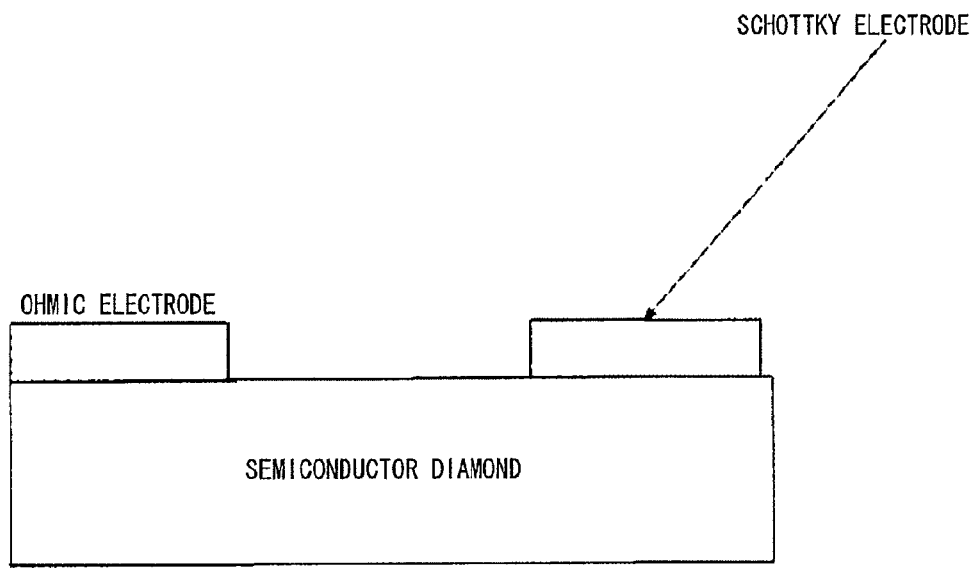
FIG. 1 is a side view of a Schottky barrier diode.

In the present invention, a Schottky electrode has a known form for use in power electronics. The Schottky electrode means a Schottky electrode performing a known action.

Accordingly, the Schottky electrode is formed on a surface of a diamond semiconductor on a substrate, and formed by plural electrodes in a scattered island pattern as pattern electrode.

In order to form the Schottky electrode of the present invention, a resist or a metal mask is prepared on the surface of the diamond semiconductor in a pattern of the Schottky electrode is drawn, and an electron beam evaporation method or various sputtering methods are used. As the resist or the metal mask which is used in the present invention, a known one can be used.

In the present invention, any method such as an RF sputtering method can be used if it is included in the range of the electron beam evaporation method and sputtering methods. In the examples of the present invention, the RF sputtering method was used. As an etching method which is used in the present invention, any etching method can be used. For a diamond semiconductor which is used in the present invention, any type of diamond may be used, but the surfaces of the diamonds with an oxygen-terminated diamond surface are particularly suitable.

Ru, which is a typical example used in the present invention, has a resistivity of 6.71 μΩ·cm, a thermal conductivity of 117 W·m$^{-1}$·K$^{-1}$ (27° C.) and a Mohs hardness of 6.5 as basic properties. Pt has a resistivity of 9.85 μΩ·cm, a thermal conductivity of 71.4 and a Mohs hardness of 4.3.

As an electrode for conventional semiconductors, a metal thin film is used which includes at least one selected from the group consisting of Pt and Pd.

Through the use of metal, which is at least one selected from the group consisting of Pt and Pd, as an electrode for diamond semiconductors, it was understood when subjected to contact with a prober, the metal which is at least one selected from the group consisting of Pt and Pd becomes partially or completely peeled perhaps because of its low Mohs hardness. Meanwhile, through the use of a metal which includes at least one selected from the group consisting of Ru, Ir and Rh, as an electrode for diamond semiconductors, it was understood when metal thin films which includes at least one selected from the group consisting of Ru, Ir and Rh are formed on a metal thin film which includes at least one selected from the group consisting of Pt and Pd peeling does not occur even due to contact of a prober performed at the same level. Accordingly, it is possible to improve an electrode formation yield and improve electric characteristics.

Further, it was thought that it is possible to suppress local heat concentration in an electrode even when the flow of a large current is allowed and it is possible to avoid the occurrence of deterioration due to a rapid increase in a temperature at the interface and improve the reliability of the electrode from the fact that Ru, which is a typical example used in the present invention, has a low resistivity (the resistivity of Ru is less than or equal to 70% of Pt) and a good thermal conductivity (the thermal conductivity of Ru is 1.5 times that of Pt), and thus a hint for the present invention was obtained. In addition, it was found that the metal which is one selected from Ir and Rh can be used in the same manner in place of Ru.

Similarly, the characteristics of the diamond semiconductor as an electrode were unknown and could not be predicted.

In the present invention, a Schottky electrode has a known form for use in power electronics. The Schottky electrode means a Schottky electrode performing a known action.

Accordingly, the Schottky electrode is formed on a surface of a diamond semiconductor on a substrate, and formed by plural electrodes in a scattered island pattern as pattern electrode.

In the present invention, a Ru thin film has higher adhesion properties with respect to the surface of a diamond semiconductor than a metal thin film including at least one selected from the group consisting of Pt and Pd. Accordingly, it is preferable that a metal thin film including at least one selected from the group consisting of Ru, Ir and Rh has an area larger than that of a metal thin film including at least one selected from the group consisting of Pt and Pd so as to completely cover the metal thin film including at least one selected from the group consisting of Pt and Pd, and is adhered to the surface of the diamond semiconductor.

Accordingly, it is preferable that a pattern of the metal thin films including one selected from Ru, Ir and Rh be similar to a pattern of the lower metal thin films including one selected from Pt and Pd. Furthermore, it is more preferable that the size of the metal thin films which include at least one selected from the group consisting of Ru, Ir and Rh are larger than the size of the metal thin films which include at least one selected from the group consisting of Pt and Pd.

In the present invention, a metal thin film including at least one selected from the group consisting of Ru, Ir and Rh has larger adhesion properties with respect to oxides than a metal thin film including at least one selected from the group consisting of Pt, Ir, Rh and Pd. Accordingly, it is preferable that a metal thin film including at least one selected from the group consisting of Ru, Ir and Rh have an area slightly larger than that of a metal thin film including at least one selected from the group consisting of Pt and Pd so as to completely cover the metal thin film including at least one selected from the group consisting of Pt and Pd, and be adhered to an oxide insulating film.

Moreover, it was also confirmed that insulating characteristics are increased by the formation of insulating films of $SiO_2$ or $Al_2O_3$ between electrodes in a scattered island pattern.

In the present invention, an example is shown, in which in order to form an insulating thin film on a surface of a diamond semiconductor, a pattern of the Schottky electrode is given by a lift-off process and a film including one metal selected from Pt and Pd is then formed. Then, a diameter of electrode patterns which are larger than or equal to the diameter of the film including at least one metal selected from the group consisting of Pt and Pd in patterns is made to form a film including at least one metal selected from the group consisting of Ru, Ir and Rh, and the metal thin film including at least one selected from the group consisting of Ru, Ir and Rh is formed. A dry etching method can be used in place of the lift-off process.

In the present invention, any type of diamond may be used, but diamonds with an oxygen-terminated diamond surface are particularly suitable.

As the resist or the metal mask which is used in the present invention, a known one can be used. In the present invention, any method such as an RF sputtering method can be used if it is included in the range of the electron beam evaporation method and sputtering methods. In addition, as an etching method which is used in the present invention, any etching method can be used.

Next, a description will be given with concrete examples of the present invention, but the present invention is not limited thereto.

EXAMPLE 1

<Example in which alloy including Pt (99.9%) and Ru (0.1%) is used in Schottky electrode>

An alloy including Pt (99.9%) and Ru (0.1%) was prepared.

By using a diamond semiconductor device in which an oxygen-terminated p-type diamond film was formed on a substrate, a Schottky barrier diode which has an ohmic electrode (Ti/Pt/Au were alloyed) and a Schottky electrode, using the above Pt—Ru alloy was formed, as shown in FIG. 1.

In order to form a Pt—Ru alloy thin film, a metal mask was prepared on the surface of the diamond film in a Schottky electrode pattern, and an electron beam evaporation method was used. The Schottky electrode which includes electrodes in a scattered island pattern was formed by Pt—Ru alloy thin film.

Figure 2:
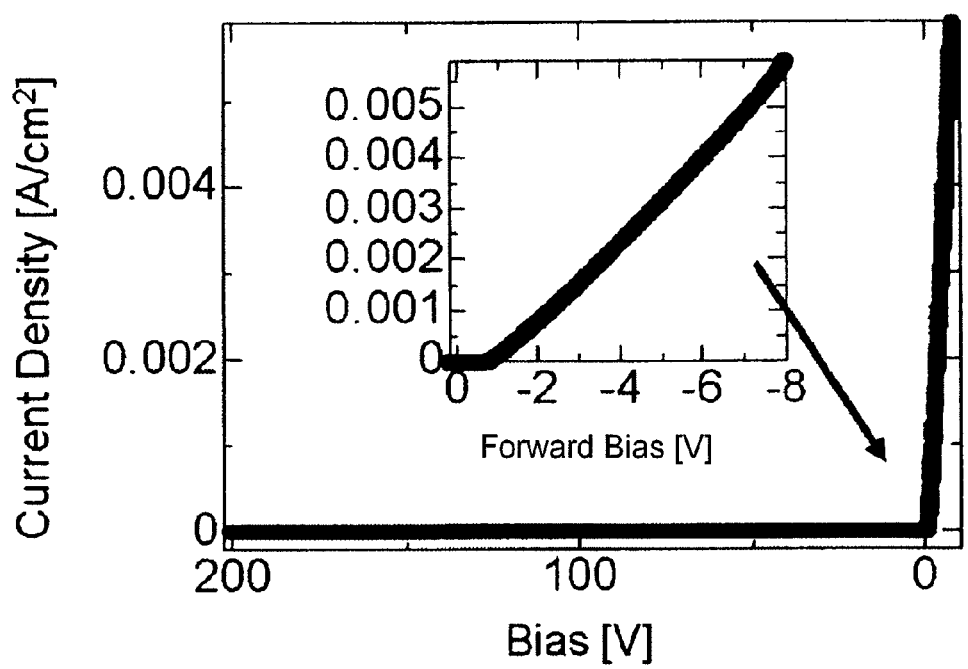
FIG. 2 shows characteristics of the Schottky barrier diode using a Pt—Ru alloy as a Schottky metal (φ30 micrometers)

FIG. 2 shows characteristics of the Schottky barrier diode using the Pt alloy of Example 1 as the Schottky metal. Good Schottky barrier diode characteristics are shown (electrode diameter φ30 μm). The Schottky barrier height was roughly 2.5 eV.

In addition, regarding Schottky electrodes using a Pt—Ru alloy and a Pt—Ir alloy, the following was found.

Adhesion properties with respect to diamonds are very good. A device which is a chemically stable Schottky electrode with a high reverse withstand voltage is obtained. The Schottky electrode is also resistant to hydrofluoric acid and aqua regia. The Schottky electrode has a small reverse leak current. Good Schottky junction is obtained. Adhesion properties with respect to an oxide film are good.

EXAMPLE 2

A diamond semiconductor device which formed a boron-doped p-type diamond film with an oxygen-terminated surface on a substrate was prepared.

First, in order to form a Pt thin film, a metal mask was prepared on the surface of the diamond film in a Schottky electrode pattern, and an electron beam evaporation method was used. The metal mask was carefully placed again on the diamond semiconductor device in which the Pt thin film was formed, and a Ru thin film was then formed on the Pt thin film by using an RF sputtering method. The Schottky electrode including electrodes in a scattered island pattern was obtained.

EXAMPLE 3

A diamond semiconductor device which formed a boron-doped p-type diamond film with an oxygen-terminated surface on a substrate was prepared.

In order to obtain a field plate structure, a Pt thin film was formed on a diamond film on the substrate by performing an electron beam evaporation method, an insulating film of $SiO_2$ was formed by a chemical vapor deposition (CVD) method, and then the region of the Pt thin film was etched to form a pattern larger than the Pt thin film. Thereafter, a Ru thin film was formed by using an RF sputtering method, and a Schottky electrode including electrodes in a scattered island pattern with the field plate structure was obtained.

EXAMPLE 4

In Example 4, an $Al_2O_3$ film was formed in place of the $SiO_2$ film of Example 3. First, with $Al_2O_3$, a pattern having a hole for the Schottky electrode was formed on a resist by an electron beam drawing device, and the $Al_2O_3$ film was formed by an ion beam sputtering method. After unnecessary parts ware removed by a lift-off process, a pattern having a hole corresponding to the region of the hole for the Schottky electrode was formed again on a resist by the electron beam drawing device and a Pt thin film was then formed by an electron beam deposition method. After the unnecessary parts ware removed, a pattern similar to and slightly larger than the electrode was drawn on a resist by the electron beam drawing device and a Ru film was formed by sputtering. The Schottky electrode including electrodes in a scattered island pattern with the field plate structure was obtained.

The diodes using the Schottky electrodes were obtained in Examples 2 to 4.

Diode characteristics: Rectifying characteristics of the Ru laminated diode were obtained in which platinum was used as the Schottky electrode in the oxygen-terminated p-type semiconductor diamond. In the reverse direction, current leakage did not exceed a detection limit even at 200 V or more.

The Schottky electrode, which was obtained in Example 3 and included the electrodes in a scattered island pattern with the field plate structure, was subjected to the following test.

Adhesion properties test: A device of 30 micrometers diameter having a Pt- Pt/Ru lamination structure was formed on an oxygen-terminated diamond semiconductor, and the adhesion properties of the device ware examined. At this time, Pt and Ru were the same in diameter. Regarding the solutions, acetone was used for the lamination structure, while resist remover and acetone were used for the single Pt layer.

Figure 3:
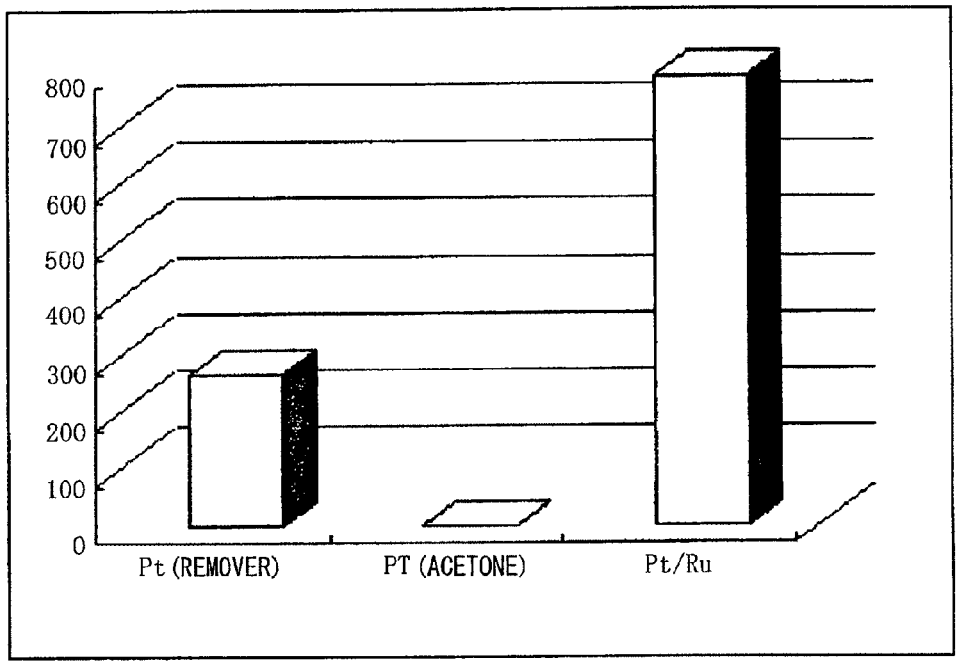
FIG. 3 shows the number of remaining devices after one-hour ultrasonic cleaning.

(1) The number of remaining devices after one-hour of ultrasonic cleaning (the total number was 800) are shown in FIG. 3.

Figure 4:
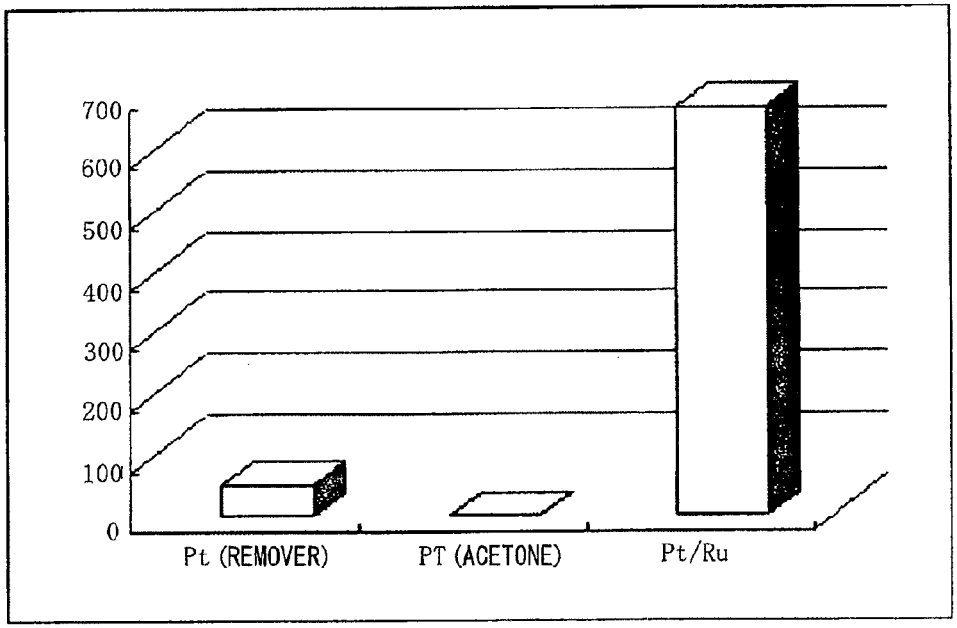
FIG. 4 shows the number of remaining devices after further peeling using sellotape (registered trade name).

(2) The number of remaining devices after further peeling using sellotape (registered trade name) are shown in FIG. 4. Obviously, the adhesion of the lamination structure is excellent.

INDUSTRIAL APPLICABILITY

A Schottky electrode of the present invention in a diamond semiconductor device is produced at a lower cost than platinum, and does not cause a reduction in yield in a diode forming process. Accordingly, the Schottky electrode of the present invention is suitable for the production of diodes and has an extremely high potential in industry. The Schottky electrode of the present invention is very hard, has excellent adhesion properties and heat resistance, and has extremely high industrial applicability.

What is claimed is:

1. A Schottky diamond semiconductor device comprising: a diamond substrate; and a Schottky electrode comprising:
Pt-group alloy thin films formed by a Pt-group alloy on a surface of the diamond substrate in a scattered islands pattern,
wherein the Pt-group alloy includes 50 to 99.9 mass % of Pt, and 0.1 to 50 mass % of Ru.

2. The Schottky diamond semiconductor device according to claim 1, wherein the Pt-group alloy further includes Ir.

3. The Schottky diamond semiconductor device according to claim 2, wherein the surface of the diamond substrate is made of an oxygen-terminated diamond.

4. The Schottky diamond semiconductor device according to claim 1, wherein the surface of the diamond substrate is made of an oxygen-terminated diamond.

5. A Schottky diamond semiconductor device including Schottky electrodes in a scattered islands pattern, the Schottky diamond semiconductor device further comprising:
a diamond substrate; the Schottky electrodes including:
metal thin films which include Pt and are formed on a surface of the diamond substrate in a scattered islands pattern; and
metal thin films which include Ru and are provided on all of the metal thin films including Pt.

6. The Schottky diamond semiconductor device according to claim 5,
wherein a pattern of the metal thin films which include Ru are similar to a pattern of the lower metal thin films which include Pt, and
the metal thin films which include Ru have the same size as or are larger than the metal thin films which include Pt.

7. The Schottky diamond semiconductor device according to claim 6, wherein insulating films of $SiO_2$ or $Al_2O_3$ are formed between the Schottky electrodes in a scattered islands pattern.

8. The Schottky electrode according to claim 5, wherein insulating films of $SiO_2$ or $Al_2O_3$ are formed between the electrodes in a scattered islands pattern.

9. The Schottky electrode according to claim 5, wherein the surface of the diamond substrate is made of an oxygen-terminated diamond.

10. A method of manufacturing a Schottky electrode comprising:
a first step of preparing a resist or a metal mask on a surface of a diamond film formed on a substrate in pattern of the Schottky electrode, and forming metal thin films including Pt by an electron-beam evaporation method or a sputtering method thereon; and
a second step of preparing a resist or a metal mask in pattern of the Schottky electrode, and forming metal thin films including Ru by the electron-beam evaporation method or the sputtering method thereon.

11. The method of manufacturing a Schottky electrode according to claim 10,
wherein the patterns are similar to each other, and
an area of the pattern, in which the metal thin films including Ru which are formed on the metal thin films including Pt are provided, is larger than an area of the pattern in which the metal thin films including Pt are provided.

12. The method of manufacturing a Schottky electrode according to claim 11 further comprising:
forming insulating films of $SiO_2$ or $Al_2O_3$, after the first step; and
etching the insulating films of $SiO_2$ or $Al_2O_3$ in regions corresponding to the metal thin films including Pt or regions covering the metal thin films including Pt before the second step.

13. The method of manufacturing a Schottky electrode according to claim 10 further comprising:
forming insulating films of $SiO_2$ or $Al_2O_3$, after the first step; and
etching the insulating films of $SiO_2$ or $Al_2O_3$ in regions corresponding to the metal thin films including Pt or regions covering the metal thin films including Pt before the second step.

14. A method of manufacturing a Schottky electrode comprising:
forming insulating films of $SiO_2$ or $Al_2O_3$ on a surface of a diamond film formed on a substrate;
forming scattered holes for electrodes by etching or a lift-off process;
forming a resist in patterns larger than the holes for the electrodes are drawn;
forming metal thin films including at least one selected from the group consisting of Pt and Pd by an electron-beam evaporation method or a sputtering method;
removing the resist and metal thin films on the resist in regions outside of the Schottky electrodes;
forming patterns which are larger than the metal thin films including at least one selected from the group consisting of Pt and Pd by applying a resist on the metal thin films including at least one selected from the group consisting of Pt and Pd;
forming holes reaching to the metal thin films including at least one selected from the group consisting of Pt and Pd;
forming metal thin films including at least one selected from the group consisting of Ru, Ir and Rh by the electron beam evaporation method or the sputtering method; and
removing the resist and metal thin films on the resist in regions outside of the Schottky electrodes.

* * * * *